United States Patent
Ünal et al.

(10) Patent No.: US 10,409,946 B2
(45) Date of Patent: Sep. 10, 2019

(54) PROCESS ARTEFACT COMPENSATION UPON TRANSFER OF A MASK LAYOUT ONTO A MASK SUBSTRATE

(71) Applicant: GenISys GmbH, Taufkirchen (DE)

(72) Inventors: Nezih Ünal, Taufkirchen (DE); Christoph Sambale, Holzkirchen (DE)

(73) Assignee: GenISys GmbH, Taufkirchen (DE)

( * ) Notice: Subject to any disclaimer, the term of this patent is extended or adjusted under 35 U.S.C. 154(b) by 0 days.

(21) Appl. No.: 14/812,011

(22) Filed: Jul. 29, 2015

(65) Prior Publication Data

US 2016/0078166 A1 Mar. 17, 2016

(30) Foreign Application Priority Data

Jul. 30, 2014 (EP) .................................... 14002648

(51) Int. Cl.
*G06F 17/50* (2006.01)
*G03F 1/70* (2012.01)
(Continued)

(52) U.S. Cl.
CPC ............ *G06F 17/5081* (2013.01); *G03F 1/70* (2013.01); *G03F 1/78* (2013.01); *G03F 7/705* (2013.01);
(Continued)

(58) Field of Classification Search
CPC .... G06F 17/5081; G03F 1/78; G03F 7/70616; G03F 1/70; G03F 7/70625; G03F 7/70508; G03F 7/705
See application file for complete search history.

(56) References Cited

U.S. PATENT DOCUMENTS 6,348,288 B1 2/2002 Yu et al.
7,849,423 B1 12/2010 Yenikaya et al.
(Continued)

FOREIGN PATENT DOCUMENTS

JP 2003-287875 A 10/2003
JP 2012-501476 A 1/2012
(Continued)

OTHER PUBLICATIONS

Voelkel et al., "Lithographic process window optimization for mask aligner proximity lithography", Proceedings of SPIE, SPIE—International Society for Optical Engineering, US, Mar. 31, 2014, vol. 9052, pp. 1-11, Cited in Extended European Search Report.
(Continued)

*Primary Examiner* — Nha T Nguyen
(74) *Attorney, Agent, or Firm* — Westerman, Hattori, Daniels & Adrian, LLP

(57) ABSTRACT

The present disclosure relates to beam writing technologies. In detail, a technique for compensating process artifacts of a mask layout transfer process is described. A method implementation of that technique comprises modeling, for a target mask layout, an intensity profile resulting from exposing a resist on a masking layer by beam writing. Further, a contour and a profile of the exposed resist after development are modeled from the intensity profile. Then, a geometry of the masking layer after etching is modeled from the resist contour and the resist profile. For any deviation of the modeled geometry from the target mask layout, an adjustment compensating the deviation can thus be determined.

10 Claims, 12 Drawing Sheets

(51) Int. Cl.
*G03F 7/20* (2006.01)
*G03F 1/78* (2012.01)
(52) U.S. Cl.
CPC ...... *G03F 7/70508* (2013.01); *G03F 7/70616* (2013.01); *G03F 7/70625* (2013.01)

(56) References Cited

U.S. PATENT DOCUMENTS

| | | | |
|---|---|---|---|
| 7,921,383 | B1 | 4/2011 | Wei |
| 2002/0083408 | A1 | 6/2002 | Haffner et al. |
| 2003/0139055 | A1 | 7/2003 | Hasegawa et al. |
| 2007/0282574 | A1* | 12/2007 | Huang .................. G03F 7/705 703/2 |
| 2009/0233193 | A1 | 9/2009 | Tanaka et al. |
| 2011/0318672 | A1* | 12/2011 | Ogadhoh ................ G03F 1/36 430/5 |
| 2012/0179282 | A1 | 7/2012 | Sarma et al. |
| 2012/0183891 | A1 | 7/2012 | Minamide et al. |
| 2013/0204594 | A1* | 8/2013 | Liu .................... G06F 17/5009 703/2 |
| 2014/0114634 | A1* | 4/2014 | Song ..................... H01J 37/3174 703/13 |
| 2016/0231654 | A1* | 8/2016 | Hsu ..................... G03F 7/70125 |
| 2017/0176864 | A1* | 6/2017 | Hsu ..................... G03F 7/70066 |

FOREIGN PATENT DOCUMENTS

| | | |
|---|---|---|
| JP | 2012-150214 A | 8/2012 |
| JP | 2013024990 A | 2/2013 |
| WO | 2010025061 A2 | 3/2010 |

OTHER PUBLICATIONS

Motzek et al., "Mask aligner lithography simulation—From lithography simulation to process validation", Microelectronic Engineering, Oct. 1, 2012, vol. 98, pp. 121-124, Cited in Extended European Search Report.

Extended European Search Report dated Jun. 2, 2015, issued in counterpart Application No. 14002648.5 (7 pages).

Office Action dated Feb. 5, 2019, issued in counterpart Japanese Application No. 2015-148336, with English translation (26 pages).

* cited by examiner

Least Steep

Less Steep

Steep

PROCESS ARTEFACT COMPENSATION UPON TRANSFER OF A MASK LAYOUT ONTO A MASK SUBSTRATE

TECHNICAL FIELD

The present disclosure generally relates to aspects of fabricating a mask for optical lithography. In particular, a technique for compensating process artefacts upon a transfer of a mask layout onto a mask substrate is presented. The technique can be implemented in the form of a method, a computer program product and an apparatus.

BACKGROUND

The manufacturing of semiconductor devices is based on sophisticated process technologies such as optical lithography to define semiconductor structures in the submicrometer regime. Optical lithography projects light through a patterned mask to transfer the pattern into a light sensitive resist on a semiconductor substrate. It is immediately evident that any deviations of the actual mask pattern from a target mask layout deteriorate the accuracy of the lithography process. For this reason significant efforts have been put in improving mask fabrication.

Masks for optical lithography are typically fabricated using beam lithography, such as electron beam writing or laser beam writing. Beam lithography involves exposing a radiation sensitive resist on a mask substrate by beam writing. The resist is then developed to remove the exposed (in the case of a positive tone resist) or unexposed (in the case of a negative tone resist) resist portions. The resist portions that remain are used as a basis for a pattern transfer on the mask substrate. This pattern transfer step may include, for example, etching in the opened areas of the patterned resist a masking layer underneath the resist. After resist removal, the remaining, non-etched portions of the masking layer define the mask pattern.

It has been found that the pattern of the etched masking layer after resist removal often deviates from the target mask layout. There are various reasons for such deviations, including artefacts introduced by a beam-writing tool (e.g., beam blur and focus errors), physical effects of beam writing (e.g., electron scattering) and process artefacts (e.g., resist blur, process loading effects of one or both of development and etching, and pattern transfer effects).

Electron scattering correction is well established in electron beam lithography. When a resist has been exposed by electron beam writing, electron scattering prevents that the developed resist regions mirror exactly the exposed resist regions. Electron scattering occurs within the resist itself as well as at the underlying mask substrate (in terms of backscattering). As one result of electron scattering, edges of mask features in close proximity to other mask features are moved after development compared to their intended positions and compared to isolated mask features (this effect is called proximity effect). Moreover, some of the scattered electrons escape the resist towards the beam-writing tool and are reflected back by an objective lens of the tool (this effect is called fogging). Correction of backscattering, proximity effect and fogging are widely employed today to compensate electron scattering artefacts.

A further correction technique called Optical Lithography Correction (OPC) targets at compensating distortions accumulated during the overall manufacturing process of semiconductor devices. OPC corrects such distortions by moving feature edges or by adding/removing feature areas to the pattern on the lithography mask. To this end, OPC predicts the optical lithography and is calibrated using experimental data from the actual manufacturing process. Since the manufacturing process is based on a particular lithography mask, any mask imperfections also enter the OPC model via the experimental data and will thus be corrected. On the downside, OPC modeling "freezes" the mask fabrication process and cannot distinguish between distortions caused by mask fabrication on the one hand and distortions from optical lithography on the other.

In view of the various shortcomings of OPC modeling, attempts to individually model distortions caused by mask fabrication have been made. Most mask process correction attempts are based on empirical models using convolution kernels and rule-based processing. However, it was found that the empirical models often fail in case of complex mask layouts. Moreover, since the models are not based on the physics and chemistry of mask fabrication, the validity of a particular model is limited to a particular dataset defining a particular mask layout.

Attempts to consider the physics and chemistry of mask fabrication mimic and correct artefacts resulting from resist development and pattern transfer. As an example, various etch models have been proposed to correct pattern transfer artefacts. Such etch models consider density-dependent etch rates and open area-dependent etch rates.

Nonetheless, certain feature configurations such as inverse line ends or contacts can still not sufficiently be modeled taking into account these etch rate effects. On the other hand, the complexity of resist chemistry and of the physics underlying the etching step (e.g., in case of plasma etching) currently prohibit a fully exhaustive modeling of the mask fabrication process due to the computational power required for modeling the process within the given time constraints.

SUMMARY

There is a need to model deviations between a target mask layout and a geometry of a masking layer after etching. Further, there is a need to compensate such deviations upon mask fabrication.

According to one aspect, a method of compensating process artefacts of a mask layout transfer process is provided. The method comprises modeling, for a target mask layout, an intensity profile resulting from exposing a resist on a masking layer by beam writing; modeling, from the intensity profile, a contour and a profile of the exposed resist after development; modeling, from the resist contour and the resist profile, a geometry of the masking layer after etching; and determining, from a deviation of the modeled geometry from the target mask layout, an adjustment compensating the deviation.

In a three-dimensional resist coordinate system defining a position space in which the resist extends parallel to an x-y plane and perpendicular to a z axis, the resist contour may be approximated by or represented as a modeled extension of the developed resist in the x-y plane. The resist contour may, for example, be modeled by a (hypothetical) borderline between an area where the resist is still present after development and an area where the resist has been removed by development. It will be appreciated that the resist contour is an idealization since the resist height will typically be gradually changing in the z direction (i.e., over a certain distance in within the x-y plane).

The resist profile may be approximated by or represented as a modeled extension of the developed resist in the z direction. This extension in the z direction may be modeled over a certain distance within the x-y plane. As such, the resist profile may be indicative of more than a mere resist height. The resist profile may be indicative of a local or global resist sidewall angle. For example, the resist profile may be approximated by or represented as a modeled resist gradient and/or a modeled resist curvature (e.g., at a point on or proximate to the resist contour). The modeled resist gradient may be determined in the z direction. The modeled resist curvature may be determined within the x-y plane, for example at one- or two-dimensional mask feature details (e.g., corners, line ends, contacts, and so on).

The resist contour may be modeled in various ways. As an example, an intensity threshold may be applied to the intensity profile for modeling the resist contour. For this purpose the intensity profile may generally be given in a three-dimensional intensity coordinate system defining an intensity space. In the intensity coordinate system, the beam writing intensity for writing mask features in an x-y plane may be plotted along a z axis. The x-y plane in the resulting intensity space may coincide with the x-y plane in position space.

The intensity threshold may be a fixed or a variable intensity value defining the borderline(s) between the area(s) where the resist is still present after development and the area(s) where the resist has been removed by development. Instead of a borderline, the resist contour could also be defined a two-dimensional resist area not removed by development. Such an area, in turn, permits to derive a polygon or other closed linear geometric object defining its circumference).

The resist profile may likewise be modeled by different approaches. The resist profile may be modeled from the intensity profile. As an example, an intensity gradient may be derived from the intensity profile and may be used to model the resist profile. Additionally, or as an alternative, an intensity curvature may be derived from the intensity profile and may be used to model the resist profile. One or both of the intensity gradient and the intensity curvature may be determined within an x-y plane of the intensity coordinate system.

In one implementation, modeling the geometry of the masking layer after etching comprises selecting a point at or proximate to the resist contour; analyzing the resist contour and the resist profile at or proximate to the selected point; and modeling etching from the selected point dependent on a result of the analysis.

The resist contour may be analyzed to determine at least one of a gradient of the resist contour at or proximate to, a curvature of the resist contour at or proximate to the selected point, a resist area at or proximate to (e.g., around) the selected point, and an open area without resist at or proximate to (e.g., around) the selected point.

The gradient of the resist contour and/or the curvature of the resist contour may be determined in the x-y plane.

The resist profile may be analyzed to determine, or model, a steepness of the resist sidewall (i.e., the sidewall angle) at or proximate to the selected point. Additionally, or as an alternative, the resist profile may be modeled via one or both of the intensity gradient and the intensity curvature as derived from the intensity profile at or proximate to the selected point. The intensity gradient and the intensity curvature may be used as "predictors" for a steepness of the resist sidewall. They may generally be determined within the x-y plane of the intensity coordinate system.

Analyzing the resist contour and the resist profile may include determining an effective curvature from the intensity gradient and the intensity curvature. In such a case, the etching from the selected point may be modeled based on the effective curvature. As an example, the etching may be modeled by an etch rate derived from the effective curvature. In more detail, the etch rate can be derived by a mapping operation (e.g., a table look-up operation or an operation that is based on a functional relation) for a given effective curvature. In one variant, the effective curvature corresponds to the intensity curvature weighted by a factor derived from the intensity gradient. The factor may generally increase with decreasing values of the intensity gradient.

In certain variants, the etching may be modeled by an etch rate additionally, or alternatively, derived from the resist area at or proximate to the selected point. Further additionally or alternatively, the etch rate may be derived from the open area without resist (also called "visible area") at or proximate to the selected point. In a similar manner as described above for the effective curvature, a mapping operation may be applied to associate one or both of the resist area and the open area to a particular etch rate. The total etch rate may thus comprise multiple etch rate contributions derived from two or more of the effective curvature, the resist area, the open area without resist, and other parameters.

The method may further comprise effecting the adjustment to compensate the deviation. The adjustment can be effected in various ways, for example by effecting the adjustment in the target mask layout. In the target mask layout, feature edges may thus be moved and/or areas (e.g., polygons) may be removed from/added to the features. The adjusted target mask layout may then be used for controlling the beam writing process. In addition, or as an alternative, to adjusting the target mask layout, a beam writing dose may be adjusted. As an example, the beam writing dose may locally be increased or decreased compared to a beam writing dose derived based on the target mask layout alone (i.e., compared to a non-adjusted beam writing dose).

The method may further comprise providing a mask substrate comprising the masking layer coated with a resist and exposing the resist by beam writing. The beam writing may be controlled taking into account at least one of the adjusted mask layout and the adjusted beam writing dose.

Also provided is a computer program product comprising program code portions for performing the steps of any of methods and method aspects presented herein when the computer program product is run by a computer system. The computer program product may be stored on a computer-readable recording medium such as a semi-conductor memory, hard drive, CD-ROM or DVD-ROM. Also, the computer program product may be provided for download via a network, such as the Internet.

According to a further aspect, an apparatus for compensating process artefacts of a mask layout transfer process is provided. The apparatus comprises a processor system configured to model, for a target mask layout, an intensity profile resulting from exposing a resist on a masking layer by beam writing; to model, from the intensity profile, a contour and a profile of the exposed resist after development; to model, from the resist contour and the resist profile, a geometry of the masking layer after etching; and to determine, from a deviation of the modeled geometry from the target mask layout, an adjustment compensating the deviation.

The apparatus may be configured as a computer system. The computer system may further comprise a computer-readable recording medium with a computer program product causing the processor system to execute the steps of one or more of the methods and method aspects presented herein.

Also provided is a mask fabrication system comprising a beam writing tool configured to effect the adjustment determined by the apparatus. The mask fabrication system may further comprise the apparatus presented herein. The apparatus may be coupled to the beam writing tool via a wired or wireless communication link, or may be an integral part of the beam writing tool.

BRIEF DESCRIPTION OF THE DRAWINGS

Further aspects, details and advantages of the present disclosure will become apparent from the following description of exemplary embodiments and the drawings, wherein.

DETAILED DESCRIPTION

In the following description of exemplary embodiments, for purposes of explanation and not limitation, specific details are set forth, such as particular pattern transfer processes, in order to provide a thorough understanding of the technique presented herein. It will be apparent to one skilled in the art that the technique presented herein may be practiced in other embodiments that depart from these specific details. For example, while the following embodiments will primarily be described with respect to electron beam writing, it will be appreciated that the technique presented herein could also be implemented in connection with laser beam writing.

Moreover, those skilled in the art will appreciate that certain methods, functions and procedures presented herein may be implemented using software in conjunction with a programmed microprocessor, digital signal processor or general purpose computer. For example, the present disclosure may be embodied in a computer program product which can be loaded on a computer system that comprises one or more processors and one or more memories, wherein the one or more memories are configured to store one or more programs that perform certain methods, functions and procedures disclosed herein when run on the one or more processors of the computer system.

Figure 1:
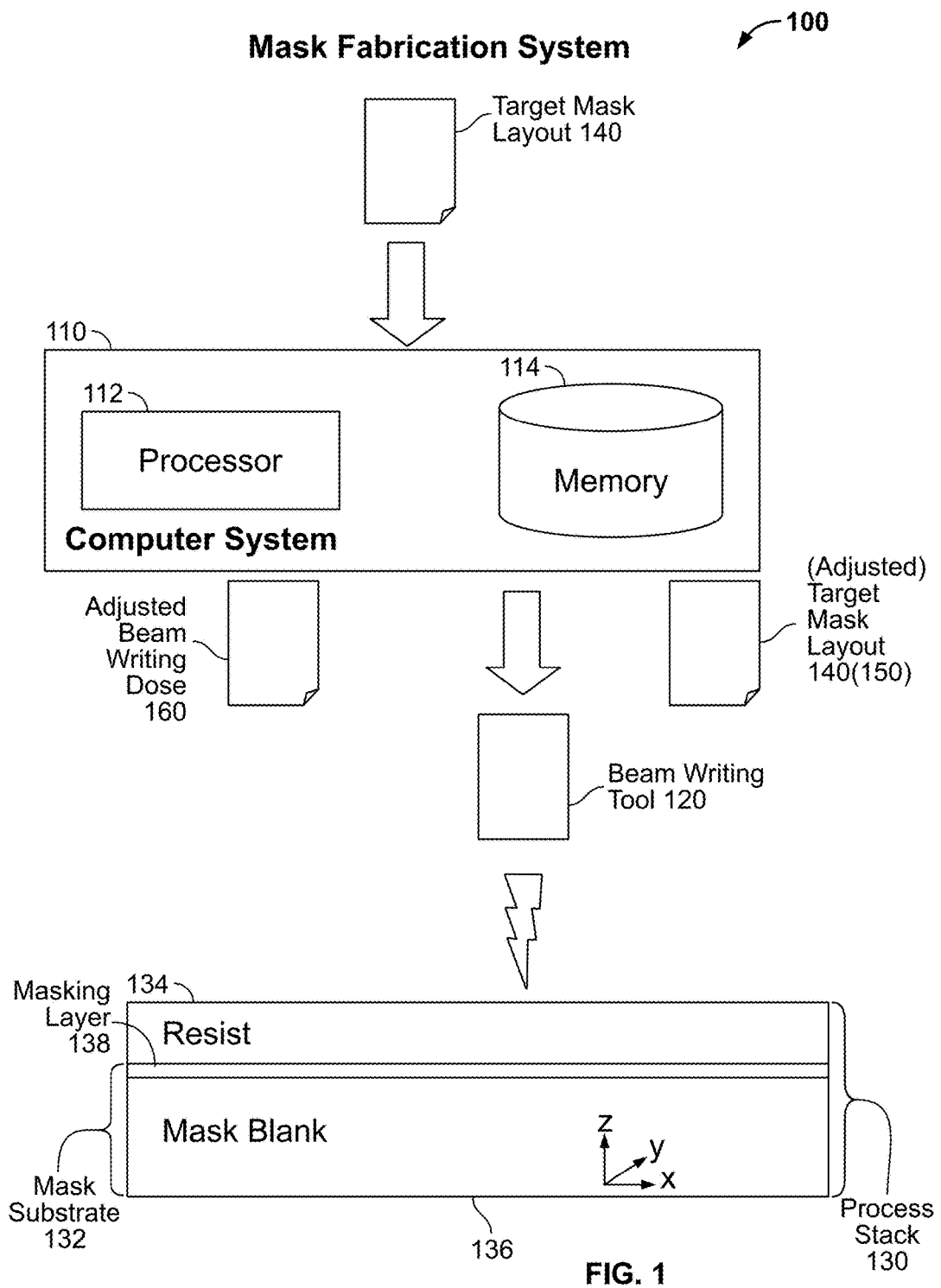
FIG. 1 schematically illustrates an embodiment of a mask fabrication system.

FIG. 1 schematically illustrates an embodiment of a mask fabrication system 100 according to the present disclosure. As shown in FIG. 1, the mask fabrication system 100 comprises a computer system 110 with at least one processor 112 (e.g., in the form of a Central Processing Unit, CPU) and a memory 114 (e.g., in the form of a semi-conductor memory) that stores program code to be run on the processor 112. The system 100 further comprises a beam writing tool 120, such as an electron beam writer or a laser beam writer. In certain configurations, the computer system 100 may be integrated as a controller in the beam writing tool 120.

Also shown in FIG. 1 is a pattern transfer process stack 130. The process stack 130 comprises a mask substrate 132 coated with a resist 134. The mask substrate 132 includes a mask blank 136 as well as a masking layer 138. For fabrication of a mask for optical lithography, the mask blank 136 may comprise fused silica on which a metallic masking material such as chromium is deposited to constitute the masking layer 138. It will be appreciated that the mask blank 136 as well as the masking layer 138 could be made from alternative materials, and the mask substrate 132 may comprise additional layers as needed (e.g., in the case of EUV masks).

Depending on the configuration of the beam writing tool 120, the resist 134 is sensitive to electron radiation or laser radiation. The resist 134 can be a positive tone resist or a negative tone resist. Different technologies known in the art may be used for coating the mask substrate 132 with the resist 134.

As illustrated in FIG. 1 by a coordinate system defining a position space, the resist 134 extends within an x-y plane over the mask substrate 132. Further, the resist 134 has an approximately constant height, or thickness, in a z direction. The z direction extends perpendicular to the lateral extensions of the mask substrate 132.

The computer system 110 is configured to operate on an input dataset representative of a target mask layout 140. The target mask layout 140 may be provided in any data format to the computer system 110. In one variant the target mask layout 140 is provided in a data format that can also be processed by the beam writing tool 120. For example, the computer system 110 and the beam writing tool 120 may be configured to derive in an intensity space a beam writing dose for each of multiple discrete points in the x-y plane from the mask layout data.

As will be explained in more detail below, the computer system 110 is configured to process the target mask layout 140 so as to estimate a deviation between the target mask layout 140 on the one hand and a modeled geometry of the masking layer 138 after the pattern transfer process on the other. The computer system 110 is further configured to determine from that deviation a compensating adjustment. The compensating adjustment can be represented by one or both of an adjusted target mask layout 150 and an adjusted beam writing dose 160.

As shown in FIG. 1, one or both of the adjusted target mask layout 150 (in the form of a suitable dataset) and the adjusted beam writing dose 160 (also in the form of a suitable dataset) is output by the computer system 110 to the beam writing tool 120. As also illustrated in FIG. 1, there are scenarios in which only the adjusted beam writing dose 160 together with the (non-adjusted) target mask layout 140 will be input to the beam writing tool 120. In other embodiments, only the adjusted target mask layout 150 may be sent to the beam writing tool 120. In still further embodiments, the beam writing tool 120 may be configured to determine the adjusted beam writing dose 160 itself on the basis of the adjusted target mask layout 150.

The beam writing tool 120 is configured to expose the resist 134 on the mask substrate 132 taking into account one or both of the adjusted target mask layout 150 and the adjusted beam writing dose 160. As explained above, an electron beam or a laser beam may be used to this end.

Figure 2:
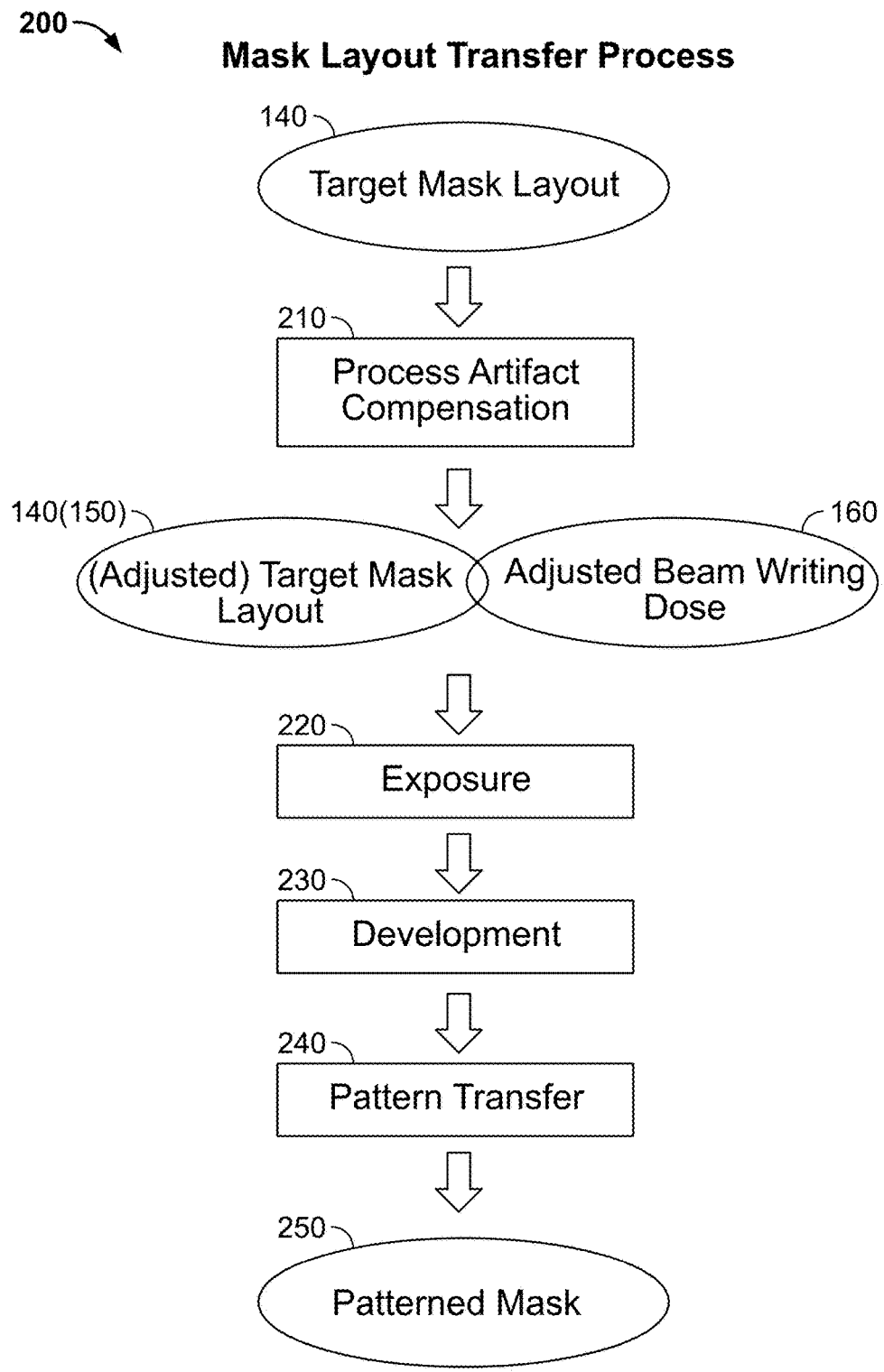
FIG. 2 is a flow diagram of a method embodiment of a mask layout transfer process.

FIG. 2 is a flow diagram 200 illustrating a method embodiment of a mask layout transfer process performed by the mask fabrication system 100 of FIG. 1 or a similar system. As shown in FIG. 2, the mask layout transfer process 200 starts with the computer system 110 receiving the target mask layout 140. The target mask layout 140 may be received as a dataset via a network connection, a data carrier (such as a DVD- or CD-Rom) or in any other manner.

Figure 3:
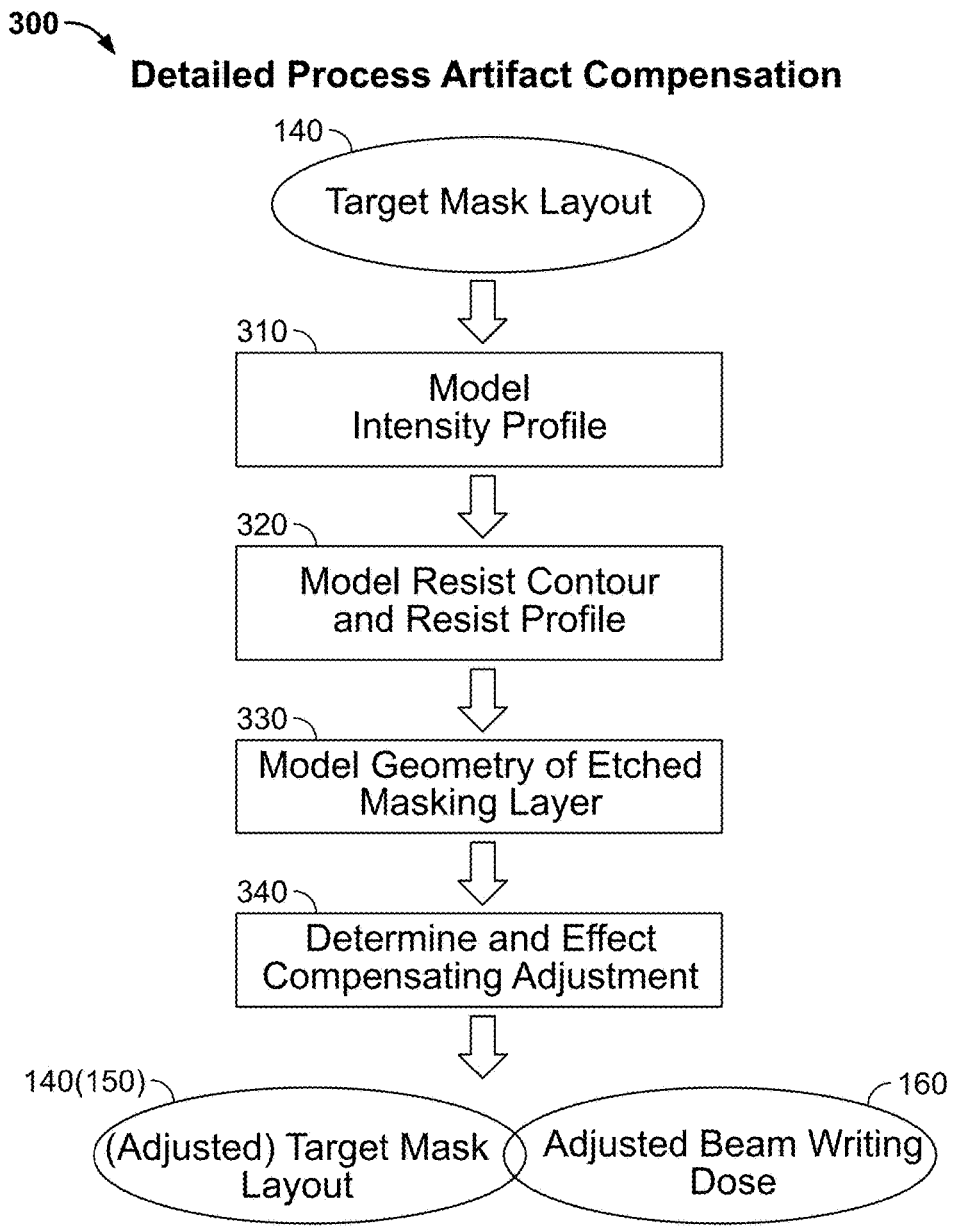
FIG. 3 is a flow diagram of a method embodiment of process artefact compensation.

In step 210 the computer system 110 processes the target mask layout 140 and, optionally, further input data to model the mask layout transfer process and determine a compensating adjustment for process artefacts as will be explained in more detail with reference to FIG. 3. As discussed above, the compensating adjustment may be effected either by an adjusted target mask layout 150, an adjusted beam writing dose 160, or both.

On the basis of one or both of the adjusted target mask layout 150 and the adjusted beam writing dose 160, the resist 134 on the mask substrate 132 is exposed by the beam writing tool 120 in step 220. Step 220 may involve either electron beam writing or laser beam writing under control of the available input data 140, 150, 160.

In a further step 230 the exposed resist 134 is developed. Development can be achieved in various ways known in the art and generally depends on the type of resist 134.

Following development, a pattern transfer step 240 is performed to obtain a patterned lithography mask in step 250. The pattern transfer step can generally be realized by etching the masking layer 138 through opened areas of the developed, or patterned, resist 134. The pattern transfer step 240 may be based on wet chemical etching or Reactive Ion Etching (RIE).

In the following, the process artefact compensation step 210 in FIG. 2 will be explained in more detail with reference to FIG. 3. Specifically, FIG. 3 shows a flow diagram 300 illustrating details of a method embodiment of process artefact compensation. The steps of flow diagram 300 may fully or partially be carried out by the computer system 110 (e.g., by running on the processor 112 program code stored in the memory 114).

The mask process signature of steps 220, 230 and 240 in FIG. 2 will in the present embodiment be modeled among others through:

i) A kernel which takes into account electron ($e^-$-solid) scattering and further process parameters. The kernel is derived in accordance with techniques known per se in the art. For this reason the kernel will not be described in more detail here.

ii) A resist model that predicts the 3D resist geometry in x, y and z directions in position space.

iii) An etch model (in the present embodiment: an RIE model) that takes into account the 3D resist geometry.

In an initial step 310, a beam writing intensity model is derived by modeling, for the target mask layout 140 and further parameters as input data, an intensity profile resulting from exposing the resist 134 on the mask substrate 132 by beam writing. The intensity profile may be provided in a three-dimensional intensity coordinate system that defines the intensity space.

The parameters analyzed in step 310 by the kernel to obtain the intensity profile include one or more of:
  exposure parameters, such as beam blur;
  physical effects of beam writing, such as electron scattering and fogging;
  process parameters, such as a process point-spread function (PSF) describing the image blur due to effects such as diffusion; and
  loading in terms of a weakening of a local etch rate in highly interacting areas due to a consumption of the etching agent.

The modeling of the intensity profile in step 310 processes, in addition to one or more of the above parameters, the target mask layout data within the x-y plane (see FIG. 1). For each coordinate point in the x-y plane an intensity value is thus derived. The intensity value is indicative of a beam writing intensity locally resulting from the beam writing tool 120. The x-y plane in position space may coincide with the x-y plane in intensity space.

Figure 4:
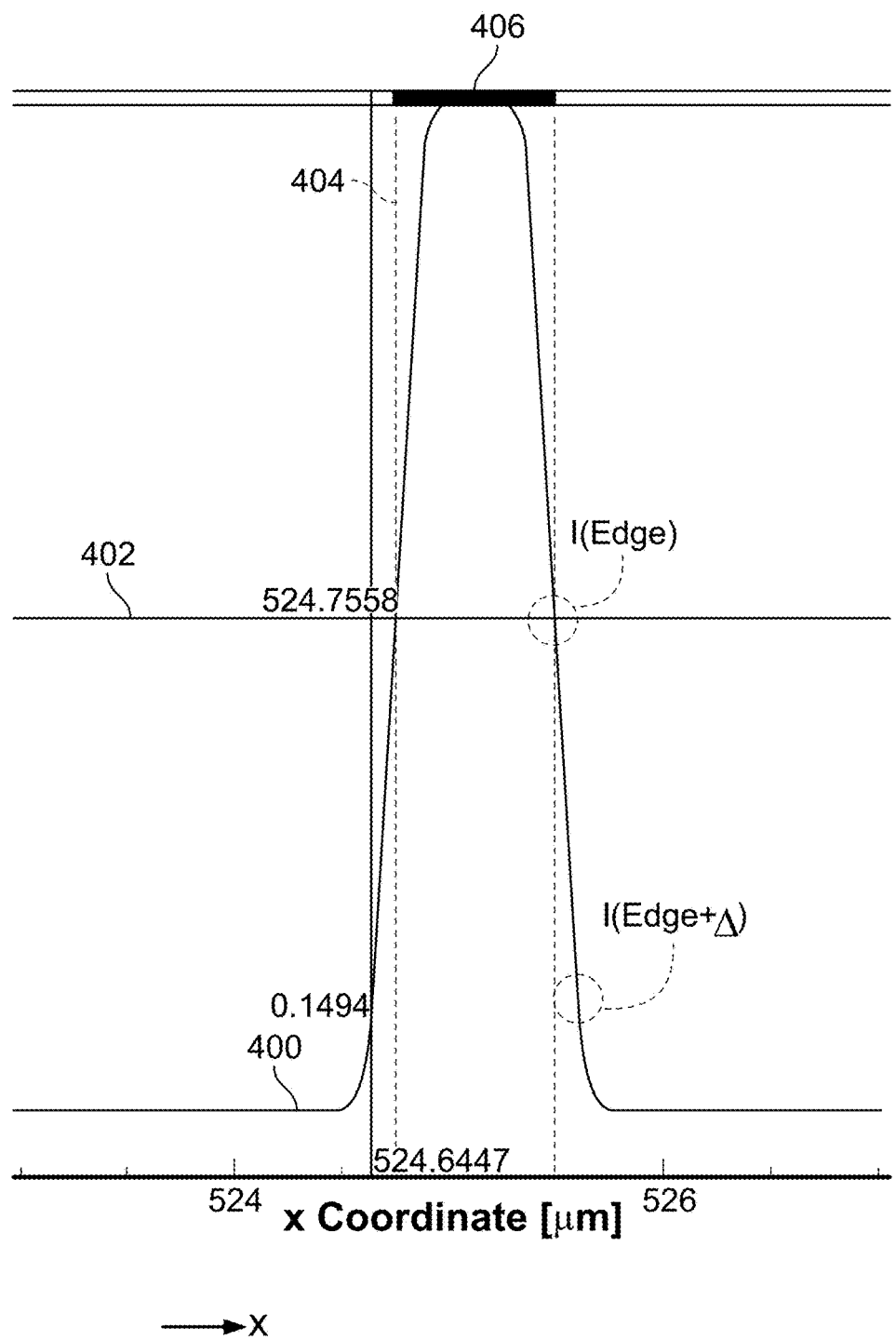
FIG. 4 schematically illustrates embodiments of a beam writing intensity profile and of operations applied thereto.

FIG. 4 illustrates an example of an intensity profile 400 (e.g., in terms of an absorbed intensity) as derived for an exemplary line or line segment feature in the target mask layout 140 parallel to the y axis and with a limited extension in the x direction. The intensity profile 400 in FIG. 4 is illustrated along the x axis and normalized to a given value.

Then, in step 320, a contour and a profile of the exposed resist 134 after development are modeled from the intensity profile 400 that has been modeled in step 310. To this end, image analysis techniques are applied to the intensity profile 400.

In the three-dimensional resist coordinate system (see FIG. 1), the resist contour derived in step 320 will be approximated by or represented as a modeled extension of the developed resist 134 in the x-y plane that extends parallel to the extension of the mask substrate 132.

The resist contour may, for example, be modeled by a resist edge (i.e., a borderline between an area where the resist 134 is still present after development and an area where the resist 134 has been removed by development) or a resist area. The resist contour is an idealization since the resist height will typically be gradually increasing in the z direction that extends perpendicular to the mask substrate 132 (i.e., over a certain distance in within the x-y plane).

With reference to FIG. 4, the resist contour is derived from the intensity profile 400 as given in intensity space by applying an intensity threshold. Each intensity value on or above a threshold value 402 is modeled to correspond to resist that has not been removed by development, whereas each intensity value below the threshold value 402 is modeled to correspond to resist that has been removed by development. As illustrated in FIG. 4, the intensity values that equal the threshold value 402 are interpreted to define the resist contour 404 (in terms of a resist edge). The associated resist area between two opposite resist edges (i.e., delimited by the resist contour 404) is denoted by reference numeral 406 in FIG. 4.

Figure 5:
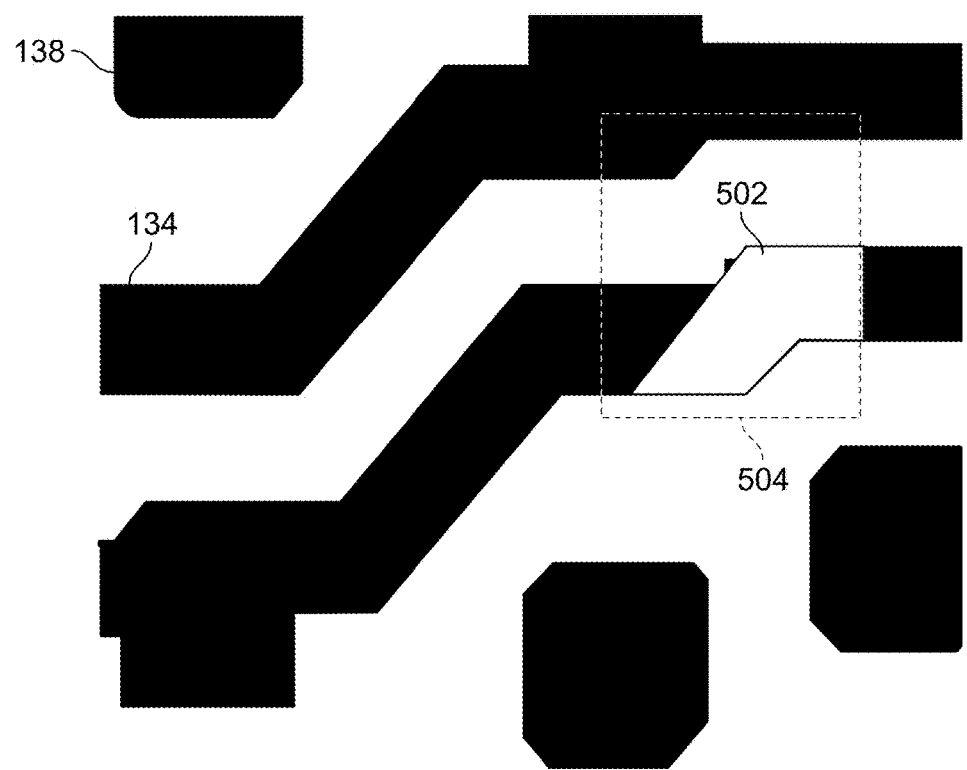
FIG. 5 schematically illustrates a modeled resist contour after resist development.
Figure 5:
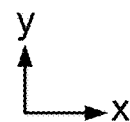
Figure 6C:
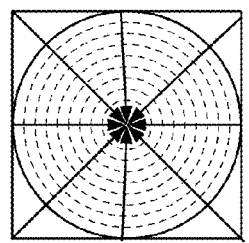
FIG. 6 highlights lateral development effects for different mask layout features.
Figure 6B:
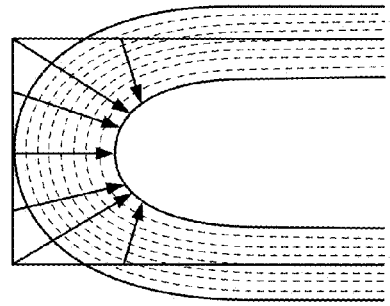
Figure 6A:
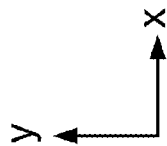
Figure 6A:
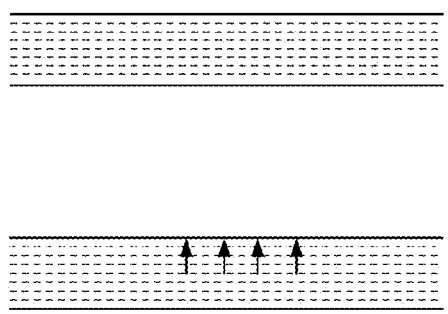

FIG. 5 illustrates in the x-y plane of position or intensity space the resist contours as derived, or modeled, by the thresholding operation discussed above for an exemplary target mask layout. The white areas in FIG. 5 illustrate the resist portions that will remain after development, and the black areas indicate where the resist 134 has been removed by development. The resist edges, or resist contours, are thus represented by the borderline between black and white areas. FIG. 5 also illustrates an exemplary point 502 on a resist contour that will be the basis for resist profile modeling.

The resist profile is indicative of an extension of the developed resist 134 in the z direction of position space as modeled over a certain distance within the x-y plane. As such, the resist profile will be indicative of, or will be used to model, a resist sidewall angle locally or globally. The resist profile is modeled, inter alia, on the basis of an intensity gradient derived from the intensity profile 400 in intensity space. To this end the intensity values may be considered at a point (e.g., point 502 in FIG. 5) on a feature contour, i.e., a feature edge, I(Edge) and at one or more points offset from the feature edge by an offset value $\Delta$, I(Edge+$\Delta$). The intensity gradient may be derived from those two intensity values.

In one example, the intensity gradient is calculated by taking the absorbed intensity I(Edge), subtracting the absorbed intensity I(Edge+$\Delta$) and dividing the difference by $\Delta$:

$$\text{Intensity Gradient } I=(I(\text{Edge})-I(\text{Edge}+\Delta))/\Delta$$

It will be appreciated that in other embodiments the intensity gradient could be derived otherwise (e.g., by considering more than two points). Moreover, the intensity gradient may be normalized to the gradient that a large feature will exhibit. Therefore, beam writing dose-corrected small isolated features will have a normalized gradient larger 1.

$$I_{norm}=(I(\text{Edge})-I(\text{Edge}+\Delta))/\Delta/\text{Gradient}_{large\ feature}$$

During development, 2D effects occur that result in a more pronounced lateral development of certain mask features such as line ends. Therefore, the resist profile or sidewall angle may also be a function of the specific extension of such a mask feature in the x-y plane.

The dependency of the resist profile on the lateral development is exemplarily illustrated in FIG. 6. For a given resist process (resist contrast, thickness and development process), it is a function of the intensity image contrast at a given point on the resist contour and its neighborhoods. The lateral development is higher for a poor contrast. In detail, compared to a line (FIG. 6A) it is more for a corner because of the development from two sides, compared to a corner it is more for a small resist line end (FIG. 6B) because of the development from three sides, and for a small inverse contact (FIG. 6C) it is highest as the lateral development is moving from all three sides. This means the resist profile in terms of the sidewall angle, or sidewall steepness, is dependent on the intensity image contrast and the 2D layout scenario in the x-y plane (i.e., the resist contour).

It has been found that the curvature of the intensity profile in the x-y plane (also called image curvature) as derived from the intensity image contrast can be used as an indicator, or "predictor", for such development effects. The intensity curvature in the x-y plane is in one embodiment derived from the intensity image contrast—when the latter is expressed as the intensity gradient in the x-y plane—as follows.

The intensity curvature may be calculated by computing the intensity gradient in the x-y plane of intensity space in the neighborhood the point of interest (such as point 502 in FIG. 5). In more detail, the intensity curvature can be computed from the divergence of the normal vector of the intensity contour (wherein the intensity contour models the resist contour as illustrated in FIG. 4). The normal vector is nothing else than the intensity gradient of the intensity contour divided by its length. In other words:

$$\text{normal vector}=\text{intensity gradient}(\text{intensity contour})/\text{length (intensity gradient}(\text{intensity contour}))$$

And therefore:

$$\text{intensity curvature}=\text{divergence}(\text{normal vector}).$$

Figure 7:
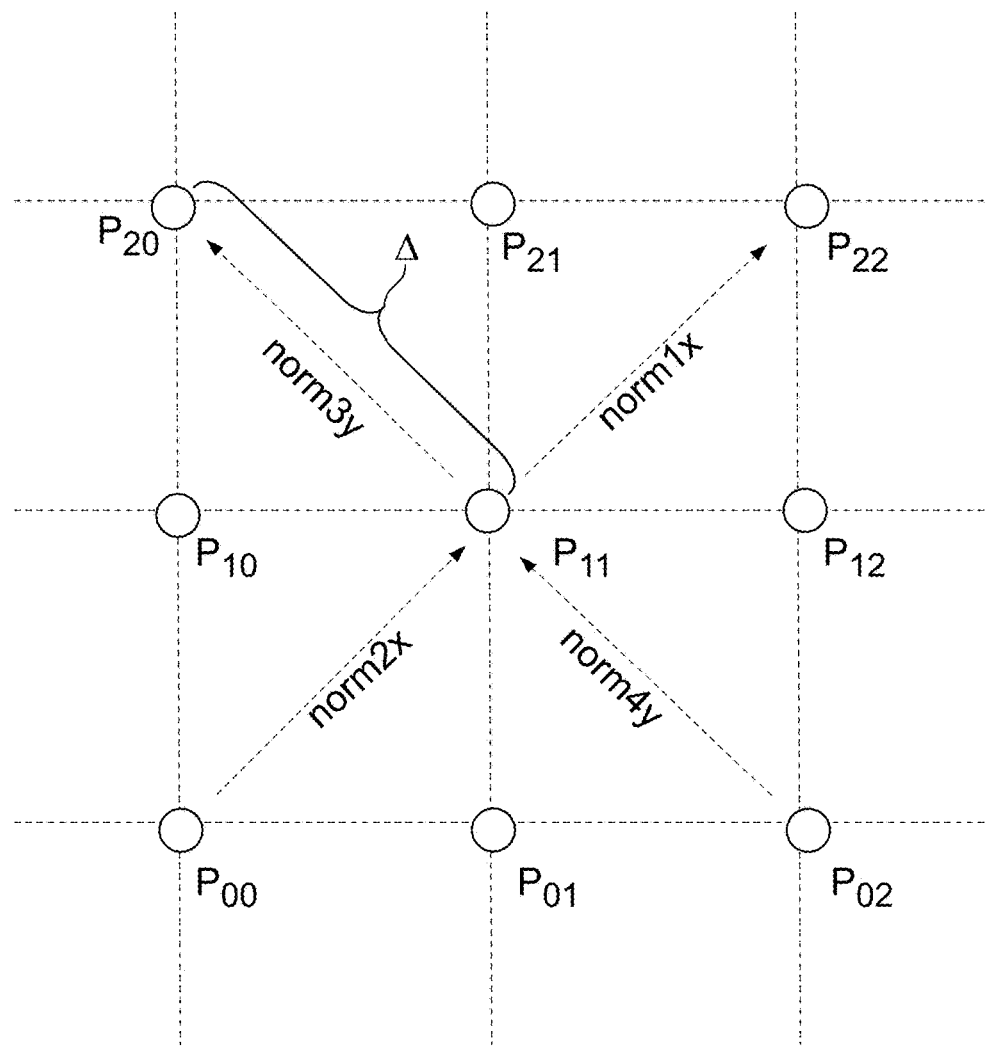
FIG. 7 schematically illustrates an embodiment of determining an intensity curvature.

FIG. 7 shows $P_{11}$ as the point of interest in the x-y place of intensity space as the points for computing the intensity gradients based on the absorbed intensities in the following nine points:

$I_{11}$: Intensity at the point of interest
$I_{10}$: Intensity delta left of the point of interest
$I_{12}$: Intensity delta right of the point of interest
$I_{01}$: Intensity delta below of point of interest.
$I_{00}$: Intensity delta below and delta left of the point of interest
$I_{02}$: Intensity delta below and delta right of the point of interest
$I_{21}$: Intensity delta above of point of interest.
$I_{20}$: Intensity delta above and delta left of the point of interest
$I_{22}$: Intensity delta above and delta right of the point of interest Based on the absorbed intensities at the above nine points, the x and y components of the local normal vectors in a coordinate system rotated within the x-y plane are calculated in accordance with:

$$\text{norm}1_x=(I22-I11)/\text{sqrt}((I22-I11)*(I22-I11)+((I12-I21)*(I12-I21)))$$

$$\text{norm}2_x=(I11-I00)/\text{sqrt}((I00-I11)*(I00-I11)+((I10-I01)*(I10-I01)))$$

$$\text{norm}3_y=(I20-I11)/\text{sqrt}((I20-I11)*(I20-I11)+((I10-I21)*(I10-I21)))$$

$$\text{norm}4_y=(I11-I02)/\text{sqrt}((I02-I11)*(I02-I11)+((I12-I01)*(I12-I01)))$$

The intensity curvature in the x-y plane at point $P_{11}$ can then be derived in accordance with ($\Delta$ being the distance between two adjacent diagonal points, e.g., between $P_{11}$ and $P_{00}$):

$$\text{intensity curvature at } P_{11}=(\text{norm}1_x-\text{norm}2_x)/\Delta+(\text{norm}3_y-\text{norm}4_y)/\Delta$$

It will be appreciated that the above formulas for calculating the intensity gradients and intensity curvatures are only examples. In other words, the intensity gradients and intensity curvatures could also be calculated otherwise to derive similar conclusions as to the resist profile.

Once the resist profile (in terms of intensity gradients and intensity curvatures within the x-y plane of intensity space) has been calculated for all points (see, e.g., point 502 in FIG. 5) along each resist contour, modeling of the exposed resist 134 after development is concluded. From the resulting resist contour and resist profile data, the etching process of the masking layer 138 underlying the developed resist 134 is modeled in step 330.

Step 330 is based on an RIE etch model. In the present embodiment, the RIE etch model takes into account various physical and chemical effects associated with RIE etching. It will be appreciated that other etchings technologies could be used as well.

RIE etching is a balance between i) deposition of a sidewall protection layer (also called passivation layer), ii) removal of the sidewall protection layer by ion bombardment, and iii) chemical etching in areas without protection layer. Therefore, the total etch bias will in the present embodiment include (in addition to a constant etch bias and an open area bias) a sidewall protection reaction and a sidewall dependent etch bias as follows:

$$Bias_{total} = Bias_{constant} + Bias_{open\ area} + Bias_{sidewall} - Bias_{protection}$$

It should be noted that in other embodiments one or more parameters giving rise to $Bias_{total}$ may be added, omitted or changed. It has, in any case, been found that the parameter $Bias_{sidewall}$ is in certain implementations particularly useful to exactly model the etching behavior. In the following, the various parameters that define $Bias_{total}$ will be discussed in more detail.

The constant bias $Bias_{constant}$ accounts for line width and density independent effects such as resist swelling and/or over/under-development. It may be provided as a constant value.

Figure 8A:
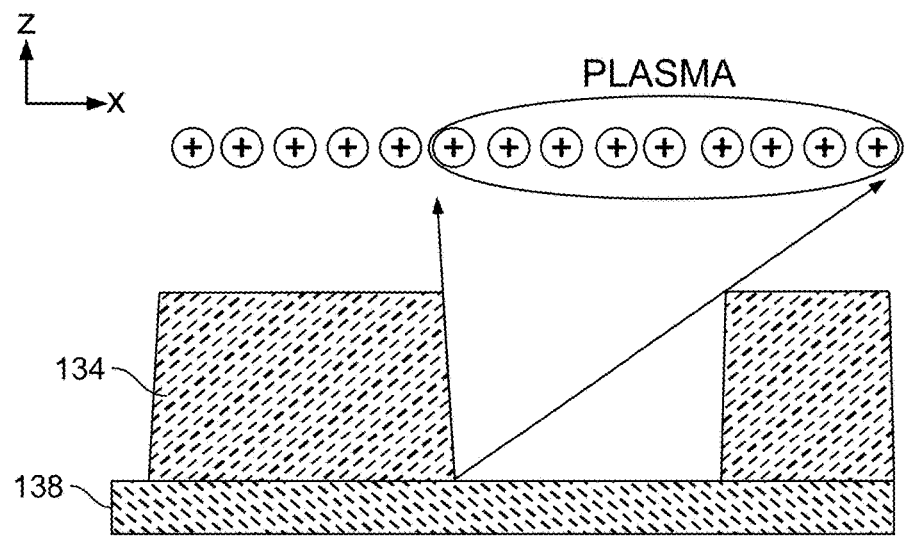
FIGS. 8A, 8B schematically illustrate the dependence of an etch rate on an open, or a visible, resist area.
Figure 8B:
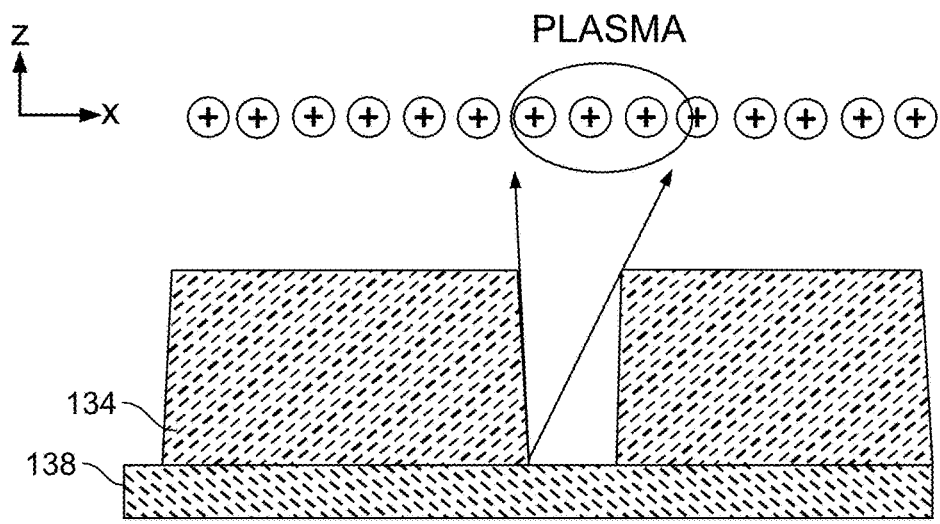

As for $Bias_{open\ area}$, the amount of ions and their angular distribution at the bottom of an individual feature of the developed resist 134 is dependent on the area visible for the plasma (i.e., the resist area opened by development). Smaller visible area means fewer and more directional ions, larger visible area means more ions and especially more non-vertical ions for removing the side-wall protection layer, leading to more lateral etching. These processes are illustrated in FIG. 8A for a larger visible area and FIG. 8B for a smaller visible area.

The mechanism for associating a particular value for $Bias_{open\ area}$ with a particular layout scenario is based on the so-called visibility polygon 504 illustrated in FIG. 5. There may be a mapping that associated open area values and values for $Bias_{open\ area}$ based on a look-up table. Alternatively, the mapping can be described by a functional relation, for example by convolving the open area defined by polygon 504 with a Gaussian of finite width, which is then mapped to $Bias_{open\ area}$ through a linear equation or a more complex function. The open area(s) may be determined on the basis of the resist contour.

Figure 9A:
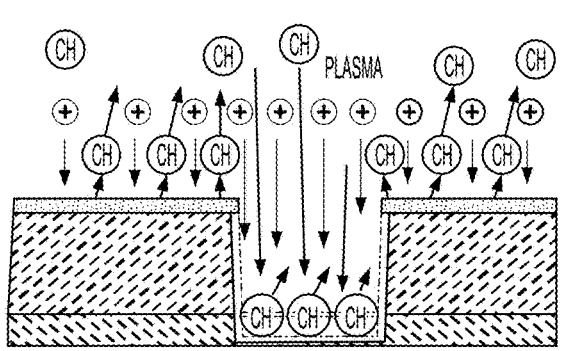
FIG. 9A, 9B, 9C and 9D schematically illustrate an RIE process with sidewall protection (polymerization), ion bombardment and resist erosion.
Figure 9B:
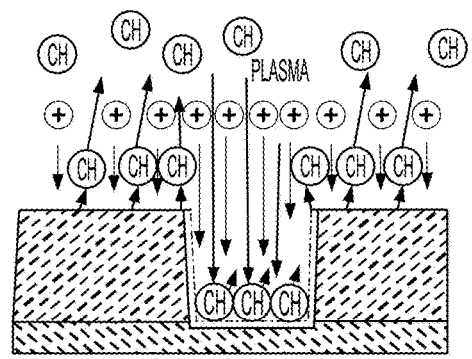
Figure 9C:
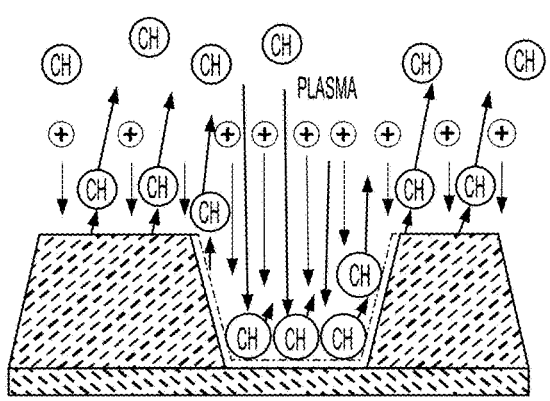
Figure 9D:
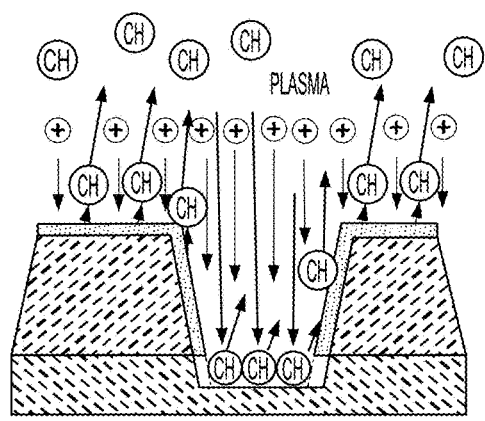

$Bias_{sidewall}$ depends on the sidewall protection layer that is basically formed by polymer (CH compounds) deposition from the plasma non-directional onto the resist sidewall and the open surface (Plasma-CVD effect). The amount of deposition depends on the gas composition in the plasma, mainly controlled by the gas including CH compounds (uniform on surface) and CH coming from resist erosion by ion bombardment (non-uniform, depends of amount of resist in neighborhood). These processes are illustrated in. FIG. 9A shows the case of a steep sidewall, whereas FIG. 9B for a slanted sidewall. The amount of polymerization at a point on the resist contour becomes a function of the resist area around that point (visible resist area).

Figure 10:
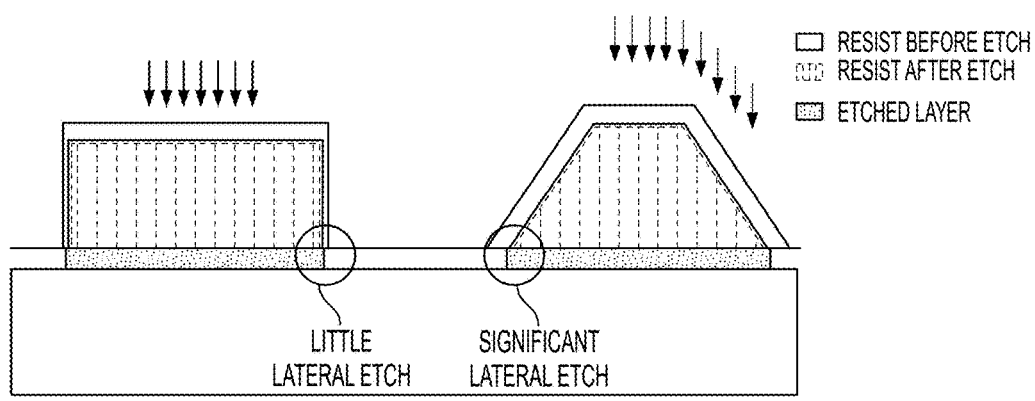
FIG. 10 schematically illustrates a lateral etch bias as a function of a resist profile (represented by a resist sidewall angle)

The sidewall protection layer needs to be removed for being able to etch material. This is enabled by ion bombardment (which is directional). The ion bombardment is not only removing the sidewall protection layer, but also eroding the developed resist 134. The amount of resist erosion at the resist sidewall is a function of the sidewall angle, or resist profile, as the relative bombardment angle of ions on a steep sidewall is shallow, resulting in lower sputter efficiency. FIG. 10 illustrates the dependency of the lateral etch bias on the steepness of the resist sidewall.

Similar to the scenarios illustrated in FIG. 6, also the attack at the sidewalls during pattern transfer by RIE is a 3D effect. At a line edge it is less because for steeper resist sidewall and ion bombardment only from one direction, at a corner it is more as the resist sidewall is less steep and the ion attack is coming from two directions, at a line-end (tip) it is stronger as the sidewall angle is even less steep and the ion attack is from three directions, and for small inverse contacts it is strongest as the resist sidewall angle is the least steep and the ion attack is coming from all directions.

Due to the complexity of the development and etch processes, full physical modeling of the 3D resist geometry and the pattern transfer during RIE is typically a computationally intensive problem. It is not in all embodiments practical to correct these effects on large scale (full mask correction). For this reason one embodiment presents a correction procedure considering the resist development and reactive ion etching with simplifying the problem by using the intensity gradient (see FIGS. 4 and 5) and the intensity curvature (see FIG. 7) within the x-y plane as "predictors" for the resist sidewall angle (i.e., the resist profile, see discussion of step 320 above), and subsequently for the pattern transfer etch bias as follows:

$$Bias_{sidewall} = f(\text{intensity gradient, intensity curvature})$$

For practical calibrations, the above formula can be simplified to one-dimensional tables. An effective curvature $curvature_{eff}$ can be computed using the intensity curvature as calculated above, modulated by the intensity gradient as follows:

$$curvature_{eff} = g(\text{intensity curvature, intensity gradient})$$
$$= g_2(\text{intensity curvature}) * f_2(\text{intensity gradient})$$

In the above formula, the effective curvature $curvature_{eff}$ is thus a function of the intensity curvature weighted by the intensity gradient. In one example, this weighting may be performed such that if the intensity curvature is negative, $curvature_{eff}$ equals the intensity curvature. On the other hand, in case the intensity curvature is positive, the intensity curvature is weighted by the intensity gradient. The weight of the intensity gradient may increase with decreasing intensity gradient. As an example, for a positive intensity curvature the intensity curvature may be divided by a power of the intensity gradient (e.g., by the third power of the intensity gradient).

$Bias_{sidewall}$ then becomes $$Bias_{sidewall} = f(curvature_{eff})$$

In general, a value of $curvature_{eff}$ may be mapped (e.g., via a look-up table or a functional relation) on a value of $Bias_{sidewall}$.

$Bias_{protection}$ finally models the fact that the amount of resist erosion at the sidewall is dependent also on the amount of protection layer deposition, which is again dependent by the amount of resist in the neighborhood. This is considered by taking the resist area around the feature edge as a parameter, in other words, to use the inverse visibility polygon as described in FIG. 5. As an example, the area of the inverse visibility polygon may be mapped (e.g., via a look-up table or a functional relation) on a value of $Bias_{protection}$.

Once $Bias_{total}$ has been determined for all relevant points (see, e.g., point 502 in FIG. 5), the etching process with respect to the masking layer 138 can be modeled for the complete target mask layout. It should be noted that $Bias_{total}$ may be given for a specific process parameter scenario (e.g., in terms of etching time and RIE process pressure). A dependency of $Bias_{total}$ on different process parameter scenarios may, for example, be modeled via different mappings (e.g., different look-up tables or functional relations for the different summands entering $Bias_{total}$)

After the geometry of the etched masking layer 138 has been determined in step 330, the resulting geometry is compared with the target mask layout 140 in step 340. Any deviations are analyzed. In case a particular deviation is above a predefined threshold, an adjustment for compensating the deviation is determined. As explained above, the adjustment can result in an adjusted target mask layout 150. Alternatively, or in addition, the beam writing dose 160 can be adjusted. As an example, modifications to the intensity profile 400 of FIG. 4 may be calculated and output as control data to the beam writing tool 120. The resulting adjustment will efficiently compensate process artefacts.

FIG. 11 illustrates the compensation of an exemplary target mask layout 140 that gives rise to an adjusted target mask layout 150. FIG. 11A visualizes an exemplary target mask layout 140 with an H-shaped mask feature. FIG. 11B depicts the geometry of the etched masking layer 138 after $Bias_{total}$ was applied to the target mask layout 140 of FIG. 11A as explained above.

Figure 11A:
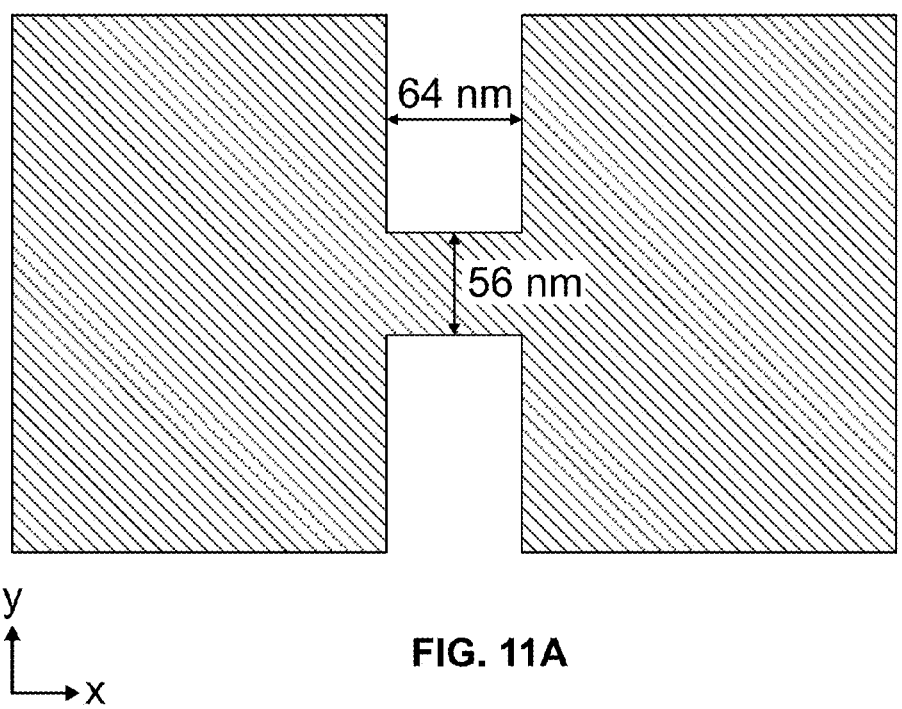
FIGS. 11A-11D schematically illustrates a compensating adjustment of a target mask layout.
Figure 11B:
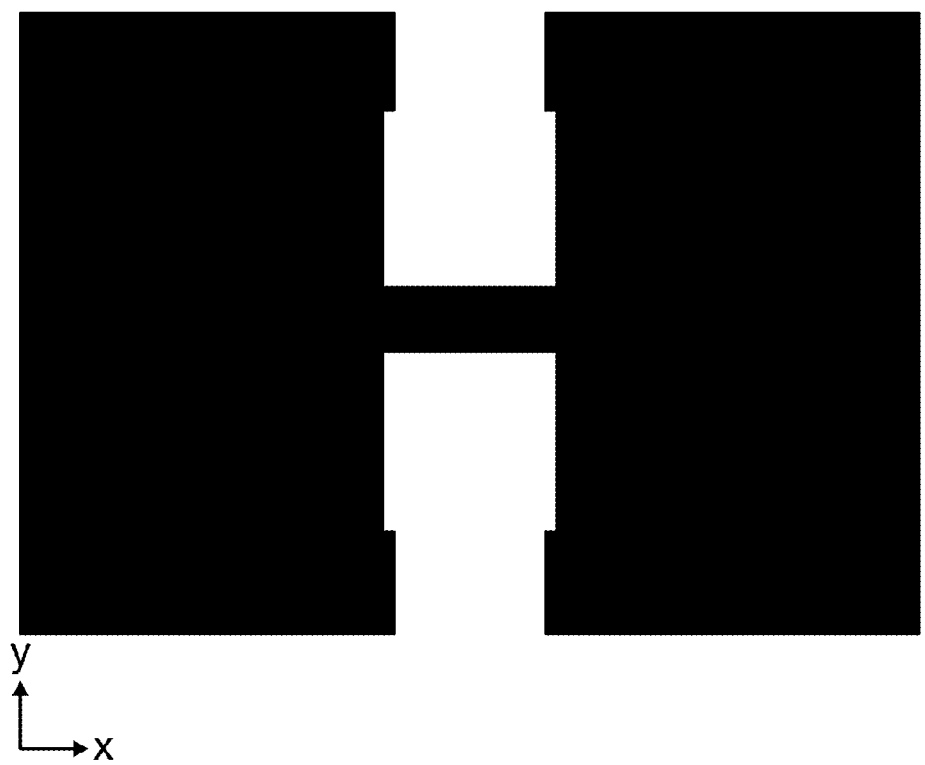
Figure 11C:
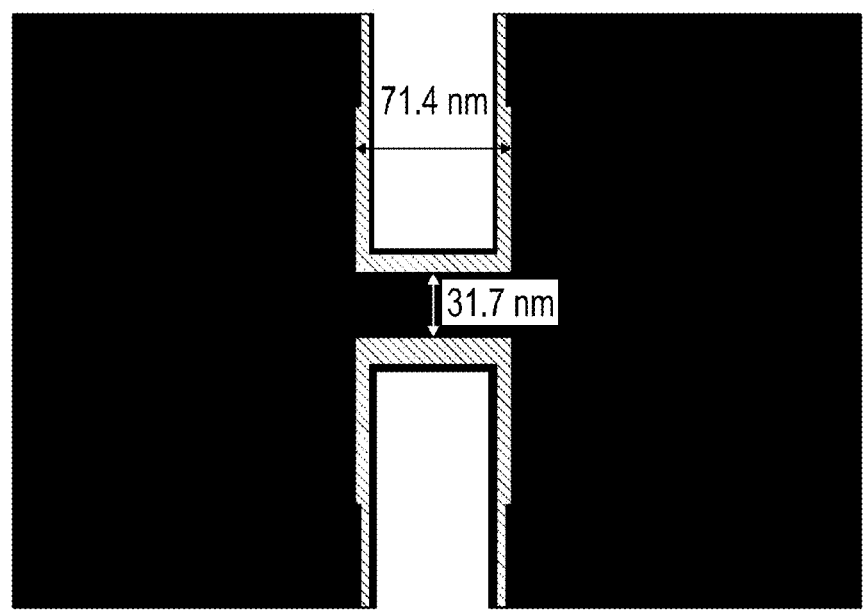
Figure 11C:
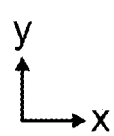

FIG. 11C depicts the adjusted target mask layout 150 after deviations between the modeled geometry of the masking layout 138 after eching from the target mask layout 140 have been determined. As becomes apparent from FIG. 11B, the artefacts of the overall process have been compensated by moving the edges of the mask features.

Figure 11D:
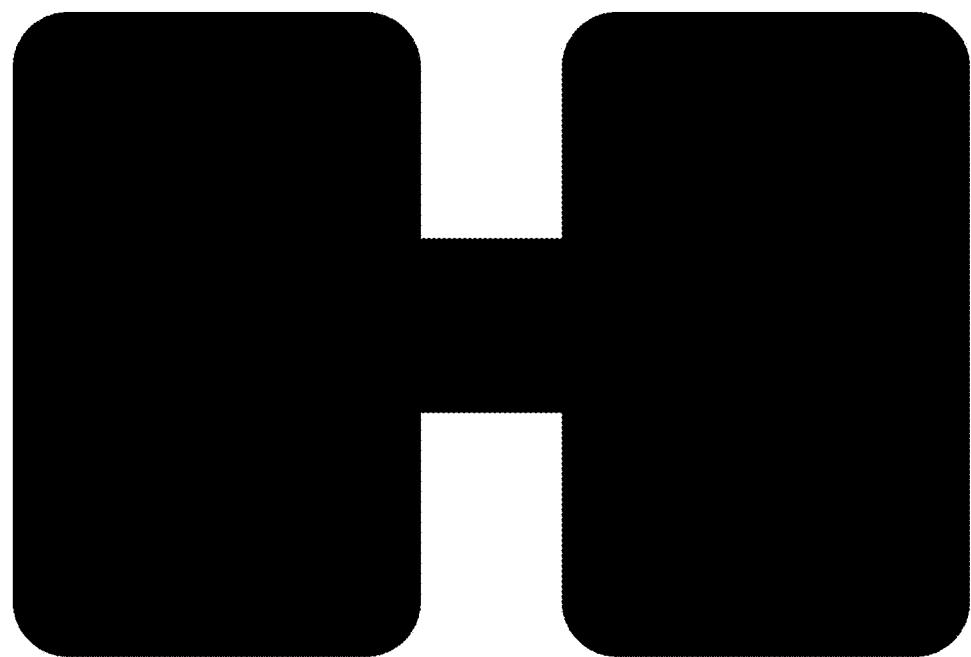
Figure 11D:
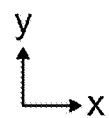

FIG. 11C depicts a superposition of the target mask layout 140 and the adjusted target mask layout 150. Further, FIG. 11D schematically shows the result of an exposure of the adjusted target mask layout 150 after development and etching. As becomes apparent from FIG. 11D, the feature edges are "on target", and the only remaining deviations are the roundings on inner and outer corners. Such roundings can generally be accepted.

Process artefacts that can be modeled in accordance with the present disclosure include on or more of:
 i) Standard blurs (beam blur, resist blur, backscattering, secondary electrons, fogging)
 ii) Shot size dependent blur (typical shaped beam effect—focal plane and blur depends on it)
 iii) Emulation of the backscatter correction
 iv) Development loading
 v) RIE micro-loading (density dependent/visible area dependent etch rates)
 vi) 3D resist profile effects on pattern transfer The technology presented herein (or parts of it) can in particular be applied for electron beam writing or laser beam writing.

The present invention has been described with reference to exemplary embodiments. It will be appreciated that the invention can be practice in other embodiments that depart from the embodiments presented herein. For this reason the invention is only limited by the scope of the claims appended hereto.

The invention claimed is:

1. A method of compensating process artifacts of a mask layout transfer process, the method comprising:
 modeling with a computer, for a target mask layout, an intensity profile resulting from exposing a resist on a masking layer by one of electron beam writing and laser beam writing, wherein the masking layer is a layer in which a mask pattern is to be formed by etching areas of the exposed resist after the exposed resist is developed;
 modeling with the computer, from the intensity profile, a contour and a profile of the exposed resist after the development;
 modeling with the computer, from the resist contour and the resist profile, a geometry of the masking layer after the etching, wherein modeling the geometry of the masking layer after etching comprises:
   selecting a point on or proximate to the resist contour;
   analyzing the resist contour and the resist profile at or proximate to the selected point; and
   modeling etching from the selected point dependent on a result of the analysis,
 wherein the resist profile is modeled via one or both of an intensity gradient and an intensity curvature as derived from the intensity profile at or proximate to the selected point, and
 wherein analyzing the resist profile includes determining an effective curvature from the intensity gradient and the intensity curvature, wherein the etching from the selected point is modeled based on the effective curvature; and
 determining with the computer, for a deviation of the modeled geometry from the target mask layout, an adjustment compensating the deviation,
 the method further comprising effecting the adjustment in the target mask layout,
 providing a mask substrate comprising the masking layer coated with the resist; and
 exposing the resist by beam writing, wherein the beam writing is controlled taking into account at least one of an adjusted target mask layout and an adjusted beam writing dose.

2. The method of claim 1, wherein the resist contour is modeled by applying an intensity threshold to the intensity profile.

3. The method of claim 1, wherein the resist profile is modeled from the intensity profile by approximating the resist profile based on at least one of an intensity gradient and an intensity curvature.

4. The method of claim 1, wherein the resist contour is analyzed to determine at least one of a gradient of the resist contour at or proximate to the selected point, a curvature of the resist contour at or proximate to the selected point, a resist area at or proximate to the selected point, and an open area without resist at or proximate to the selected point.

5. The method of claim 1, wherein the resist profile is analyzed to determine a steepness of a resist sidewall at or proximate to the selected point.

6. The method of claim 1, wherein the etching is modeled by an etch rate derived from the effective curvature.

7. The method of claim 6, wherein the etch rate is derived by a mapping operation for a given effective curvature.

8. The method of claim 1, further comprising effecting the adjustment in a beam writing dose.

9. A non-transitory computer readable medium comprising program code portions for executing on a computer system and causing the computer system to perform the steps of claim 1.

10. An apparatus for compensating process artifacts of a mask layout transfer process, the apparatus being configured to:
 model with a computer, for a target mask layout, an intensity profile resulting from exposing a resist on a masking layer by beam writing;
 model with the computer, from the intensity profile, a contour and a profile of the exposed resist after development;
 model with the computer, from the resist contour and the resist profile, a geometry of the masking layer after etching, wherein modeling the geometry of the masking layer after etching comprises:
   selecting a point on or proximate to the resist contour;
   analyzing the resist contour and the resist profile at or proximate to the selected point; and modeling etching from the selected point dependent on a result of the analysis, wherein the resist profile is modeled via one or both of an intensity gradient and an intensity curvature as derived from the intensity profile at or proximate to the selected point, and wherein analyzing the resist profile includes determining an effective curvature from the intensity gradient and the intensity curvature, wherein the etching from the selected point is modeled based on the effective curvature; and determine with the computer, for a deviation of the modeled geometry from the target mask layout, an adjustment compensating the deviation, the apparatus further configured to effect the adjustment in the target mask layout, provide a mask substrate comprising the masking layer coated with the resist; and expose the resist by beam writing, wherein the beam writing is controlled taking into account at least one of an adjusted target mask layout and an adjusted beam writing dose.

\* \* \* \* \*